United States Patent
Ozaki

(10) Patent No.: US 7,284,171 B2
(45) Date of Patent: Oct. 16, 2007

(54) INTEGRATED CIRCUIT DEVICE

(75) Inventor: Hideharu Ozaki, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 289 days.

(21) Appl. No.: 11/085,149

(22) Filed: Mar. 22, 2005

(65) Prior Publication Data

US 2005/0216803 A1    Sep. 29, 2005

(30) Foreign Application Priority Data

Mar. 29, 2004   (JP)   ............... 2004-094490

(51) Int. Cl.
    *G01R 31/28*   (2006.01)
(52) U.S. Cl. .................... 714/724; 714/30
(58) Field of Classification Search ............ 716/1; 714/718, 725, 726, 724, 30
    See application file for complete search history.

(56) References Cited

U.S. PATENT DOCUMENTS 5,337,254 A * 8/1994 Knee et al. ............... 716/1
5,459,733 A * 10/1995 Alapat ...................... 714/718
6,016,563 A * 1/2000 Fleisher ..................... 714/725
6,363,505 B1 * 3/2002 Vest et al. .................. 714/726
6,426,645 B1    7/2002 Seki

FOREIGN PATENT DOCUMENTS

| EP | 1 291 662 A | 3/2003 |
| JP | 04-213849 | 8/1992 |
| JP | 07-176618 | 7/1995 |
| JP | 2003-057309 | 2/2003 |

OTHER PUBLICATIONS

European Search Report dated Jul. 18, 2005.

* cited by examiner

*Primary Examiner*—David Ton
(74) *Attorney, Agent, or Firm*—McGinn IP Law Group, PLLC

(57) ABSTRACT

An LSI according to the present invention has a scan chain which comprises a plurality of SFFs between a buffer connected to an external pin and an internal circuit. During test mode, a test signal is inputted to the internal circuit of the LSI using the scan chain. In this case, a high-number-pins-test switch signal is inputted to an output buffer of a bidirectional pin of the external pins, set the bidirectional pin to output mode. Also, an output buffer is provided to an input pin, and the high-number-pins-test switch signal set the input pin to the output mode.

20 Claims, 7 Drawing Sheets

INTEGRATED CIRCUIT DEVICE

BACKGROUND OF THE INVENTION

1. Field of the Invention

This invention relates to an integrated circuit device which is able to test connections of an internal circuit even if it has a number of external pins.

2. Description of Related Art

Conventionally, particularly in logic LSI (Large Scale Integrated Circuit), in order to simplify the circuit functions test, it has been prevalent that the scantest circuit, which is a dedicated circuit for the testing, is arranged in the LSI, and the test is performed according to the scan path technique to check if the combination circuits are properly operating.

This scantest circuit is configured with the scan path chain in which the scan flip-flops are connected in series and operates as a shift resistor. The scan test circuit comprises scan-in pins, a scan-clock pin and scan-out pins. The scan-in pin is for inputting scan-in signal that is the data for scantest (scantest pattern) from outside or inside the LSI, the scan-clock pin is for inputting the clock from outside the LSI for scan path test, and the scan-out pin is for outputting the output data of the scantest that is the result of the scantest.

In the scan path technique, during test mode (shift mode), the scantest pattern for the test is supplied via the scan-in pins (hereafter, referred to as "scan-in"), and the scan-clock for the test is supplied to the clock pin. Then, the scantest pattern is logic-computed by the combination circuit in the LSI to output, from the scan-out pins, the result of the computation as a scantest output data (hereafter, referred to as "scan-out"). By comparing the outputted data with the predetermined expected value to check whether or not they are equal, it is possible to see if the combination circuit is properly operating. That is, if the scanned-out outputted data matches the pre-calculated projection value, it is determined that there is no defect in the combination circuit. If not, it is determined that there is a manufacturing defect. In this manner, by employing the scantest circuit, the inside of the circuit can be separated as a combination circuit, so that the testing can be simplified.

By the way, in such a test of LSI, if the number of the external signals (external pins) of the LSI is greater than that of the signals of the tester (test pins) for the testing, the new tester having more test pins (hereafter, referred to as "high-number-pins tester") is usually employed. But, employing this high-number-pins tester requires installation of additional new equipment. In addition, the high-number-pins tester is of extremely expensive device.

As an example of such a method, Japanese Unexamined Patent Application Publication No. 2003-57309 (hereafter, referred to as "related art 1") discloses that, on the LSI pad portion, test-paths, each of which can be used as one of the nodes in a logic circuit, are arranged between the input pad and the output pad in a chip, so that the number of LSIs which can be simultaneously measured is increased without reducing the failure detection rate.

In another approach, a plurality of input pins are bound onto the test board to virtually reduce the number of signals of the LSI (hereafter, referred to as "related art 2"). FIG. 7 shows the related art testing method for the integrated circuit device. As shown in FIG. 7, the LSI 201 has a number of the external pins, then four external pins, namely four input pins 2021-2024 are illustrated in FIG. 7. These input pins 2021-2024 are connected to input buffers 2031-2034 respectively. Four signal lines 2041-2044 which are to be inputted to the input pins 2021-2024 are bound into one signal line 206 on the test board 205. The test pin of the LSI tester is connected to this signal line 206 and the test signal is supplied.

It has been discovered that there is a problem with the related art 1 that a connection test of the internal circuit cannot be performed by inputting the desired test signals from each input pad, because the pad portion of the LSI is handled as one of the nodes in the logic circuit. On the other hand, there is also a problem with the related art 2, where one test signal is supplied from the bound signal lines on the test board. That is, the signal lines are externally bound into one line so that only the same value can be supplied to the input pins, thus a satisfying function test of the LSI would not be performed.

SUMMARY OF THE INVENTION

According to one aspect of the present invention, there is provided an integrated circuit device which includes a plurality of external pins and an internal circuit connected to the external pins. The plurality of the external pins comprises a test pin used during test mode, an unused external pin not used during the test mode, and a control signal input pin receiving an unused pin control signal which determines a configuration of the unused external pin during the test mode.

According to the present invention, the unused pins, which are not in use during the test mode, are controlled so that these pins are configured in output mode or their voltages are fixed to the power source level or the ground level by the unused pin control signal, for example. This enables the connection test in the LSI, even if the number of the external pins of the integrated circuit device is greater than that of the pins of the tester for testing the internal logic circuit and some of these external pins are not connected to the tester.

BRIEF DESCRIPTION OF THE DRAWING

The objects, advantages and features of the present invention will be more apparent from the following description taken in conjunction with the accompanying drawings, in which.

DESCRIPTION OF THE PREFERRED EMBODIMENTS

Figure 1:
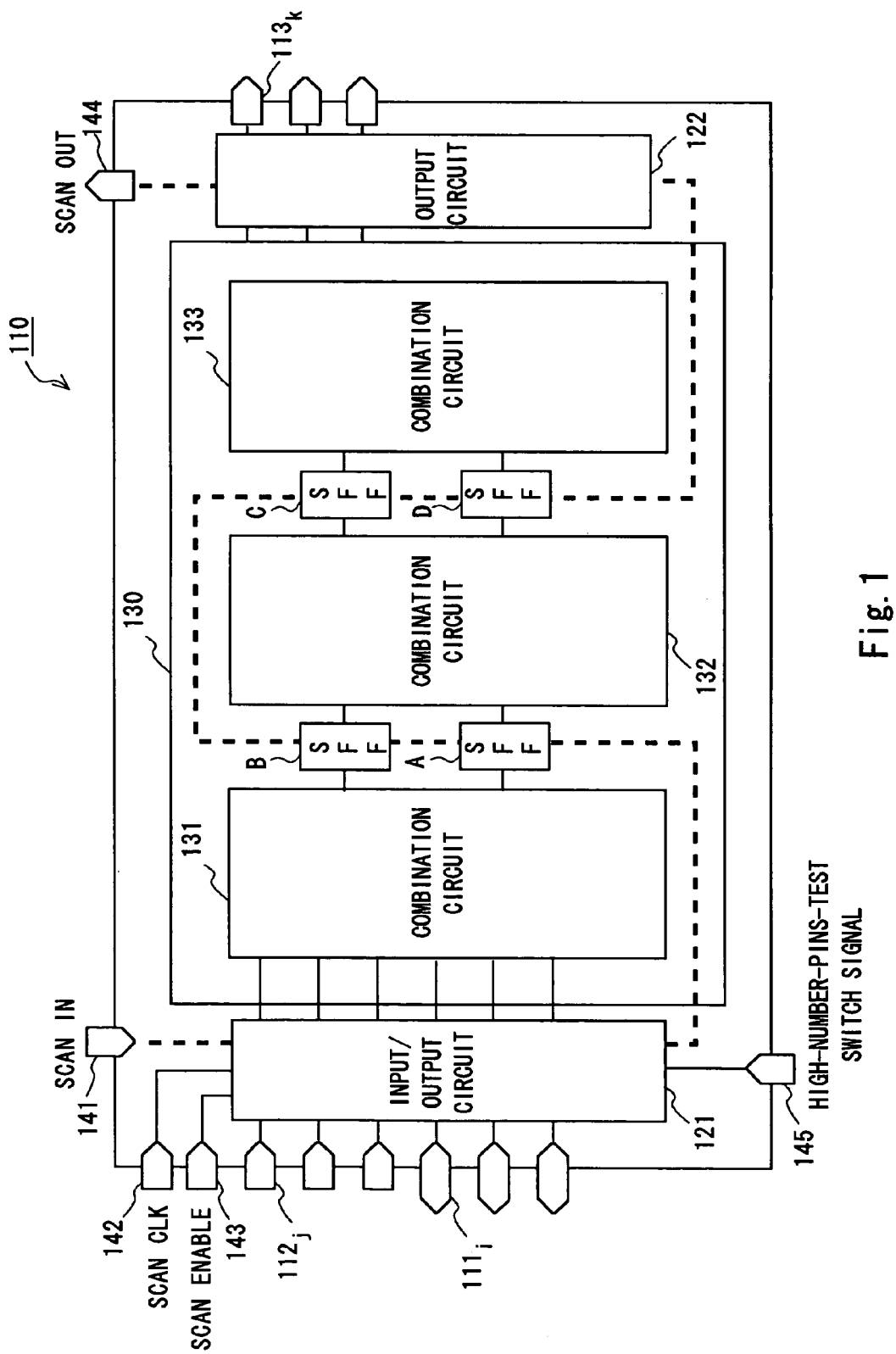
FIG. 1 is a schematic diagram illustrating the LSI according to the embodiment of the present invention.

The detailed explanations of the embodiments in accordance with the present invention are provided as follows, by referring to the drawings. With these embodiments, the present invention is applied to the large LSI where the internal connections can be tested even if the LSI has more pins than the tester to be used.

In the test of the large LSI, if the number of the external pins (the number of the external signals of the LSI) for the use of the scan path test of the internal logic circuit in the LSI is greater than the number of the test pins (the number of the signals for testing the LSI), some pins (the external signals) of the LSI may not be connected to the tester during the test of the LSI. Hereafter, in the specification, an external pin which is not connected to the tester and not in use is referred to as a floating pin.

In the case where part of the pins of the LSI are not connected and are the floating pins, the following two problems arise. That is;

1. The input pin and the bidirectional pin in input mode become open, causing the buffer destruction due to noises.

2. The signals cannot be inputted to and outputted from the floating pins, so that the satisfying test of the entire LSI cannot be performed.

Accordingly, in the first embodiment of the present invention, in order to prevent the destruction of the input buffer connected to the floating pin, the input pins and the bidirectional pins in the input mode are forced into output mode during the test mode. Then, the scan flip-flop SFF is connected to each unused external pin, and the test signals are supplied to the internal circuit using the scan chain consisting of these flip-flops.

FIG. 1 is a schematic diagram illustrating the LSI according to the present embodiment. As shown in FIG. 1, an LSI 110 comprises external pins including bidirectional pins $111_i$, input pins $112_j$ and output pins $113_k$, an input/output circuit 121 connected to the bidirectional pins $111_i$ and the input pins $112_j$, an output circuit 122 connected to the output pins $113_k$, and an internal circuit 130 that is a logic circuit in the LSI.

The bidirectional pins $111_i$, the input pins $112_j$ and the output pins $113_k$ are the external pins that are not used during the test (i.e., floating pins). In the internal circuit 130, the scan path circuit consists of the internal scan flip-flops SFF_A-SFF_D during the test mode so as to perform the scan path test of the combination circuits 131-133.

The external pins include external pins 141-143, an external pin 144 which outputs scan-out signal (SCAN OUT) that is the result of the scan path test, a high-number-pins-test switch signal pin 145 which is for inputting the high-number-pins-test switch signal. The external pin 141 is a pin for inputting the scan-in signal (SCANIN) that is the scan path test signal for the scan path test of the internal circuit 130. The external pin 142 is a pin for inputting the scan-clock signal (SCAN CLK) that is the clock signal for the scan path test. The external pin 143 is a pin for inputting the scan-enable signal (SCAN ENABLE) for selecting the output from the combination circuit or the scan-in signal. The high-number-pins-test switch signal pin 145 is a pin for inputting the high-number-pins-test switch signal that functions as the unused pin control-signal for determining the configuration of the floating pin. This signal sets the unused bidirectional pins $111_i$ and unused the input pins $112_j$ to the output mode during the test mode.

In this LSI 110, the combination circuit 131 is tested between the input/output circuit 121 and the SFF_A, SFF_B. The combination circuit 132 is tested between the SFF_A, SFF_B and the SFF_C, SFF_D. The combination circuit 133 is tested between the output circuit 122 and the SFF_C, SFF_D.

Here, the LSI 110 in the present embodiment enables the test to be performed without connecting all the external pins to the tester. The shift resistor (scan path), which consists of scan flip-flops connected to respective unused external pins, is arranged in the input/output circuit 121 and the output circuit 122 between the external pins and the internal circuit 130.

Then, output buffers are provided, as required, to the external pins which are to be the floating pins, and the floating pins are set to the output mode by the high-number-pins-test switch signals to prevent the signal input. The scan flip-flops in the input/output circuit 121 and the output circuit 122 are provided as a means for bypassing the unused pins and supplying the desired test signals to the input of the internal circuit connected to the floating pins. These scan flip-flops allow the test of the internal circuit to be performed remaining the external pins unused, that is, without inputting the test signals from the external pins.

In further details, the output buffers are connected to the input pins $112_j$ of the unused pins and the output buffers are turned on/off by the high-number-pins-test switch signal. Then, during the test mode, the output buffers are turned on by the high-number-pins-test switch signal to set to the output pins $112_j$ to the output mode. On the other hand, the output buffers of the input/output buffers for the bidirectional pins $111_i$ are controlled based on the high-number-pins-test switch signal to set the bidirectional pins $111_i$ to the output mode. Here, the high-number-pins-test switch signal pin 145 of the present invention is connected to the common signal line for supplying the high-number-pins-test switch signal to respective floating pins, and controls the floating pins simultaneously during the test mode.

It should be noted that, in FIG. 1, pins except the pins 141-144 for inputting the test signals and the high-number-pins-test switch signal pin 145 are explained as the unused pins for the purpose of illustration. However, the external pins which are not connected to the tester vary according to the number of external pins, the circuit arrangement, the type of the tester, and so on, and thus, not limited to the example as shown in FIG. 1. In addition, it is just required to set the floating pins to the output mode by the high-number-pins-test switch signal. Therefore, the floating pins may not be connected to the scan flip-flops while the above explanation is provided with the example in which respective floating pins are connected to corresponding scan flip-flops. If the floating pins are not connected to the scan flip-flops, the test of the floating pins is performed with the tester connected to the floating pins after the completion of the previous test. That is, the high-number-pins-test switch signals may be supplied to the external pins that are the potential unused pins.

Figure 2A:
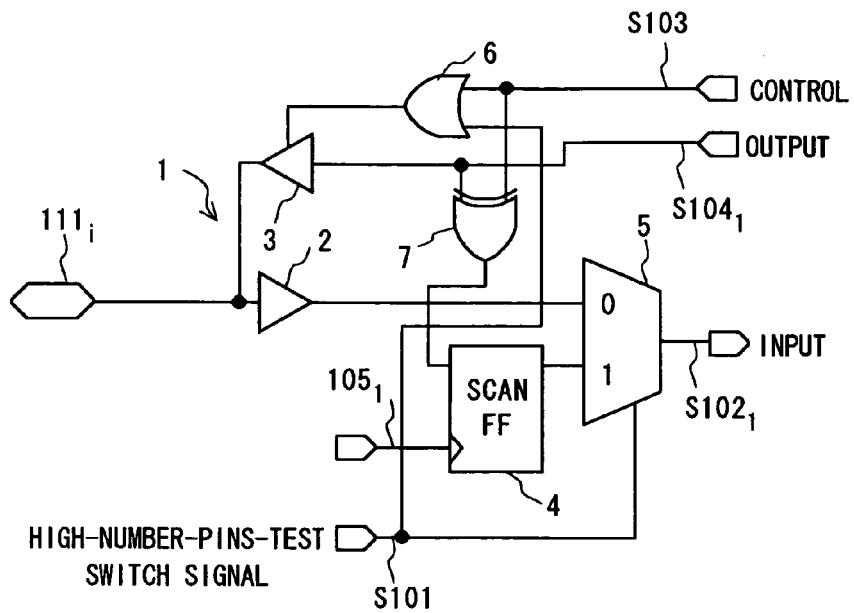
FIGS. 2A-2C are circuit diagrams showing input and output portions to the external pins of the LSI according to the embodiment of the present invention, where respective portions of a bidirectional pin, an input pin and an output pin are enlarged.
Figure 2B:
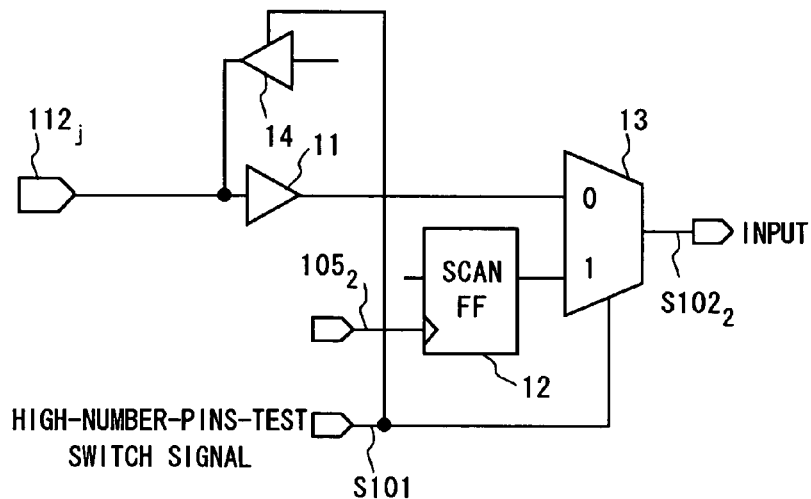
Figure 2C:
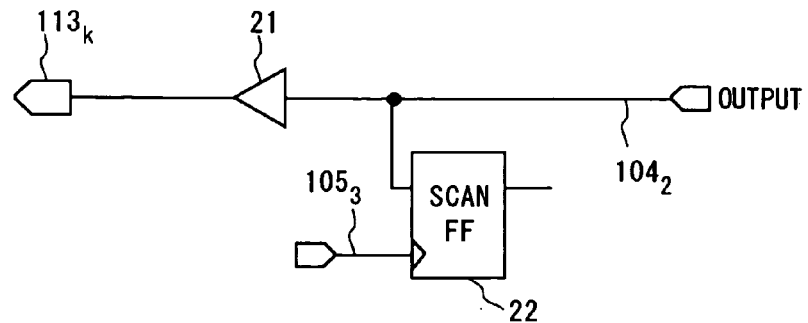

Next, the detailed explanation is further provided regarding the floating pins and the arrangement therewith in accordance with the present embodiment. FIGS. 2A-2C illustrate the input/output portion to the external pins of the LSI according to the present embodiment. FIG. 2A shows the bidirectional pin and the details of the input/output circuit portion thereof. FIG. 2B shows the input pin and the details of the input/output circuit portion thereof. FIG. 2C shows the output pin and output circuit portion thereof. As shown in FIG. 2A, in the LSI 110 of the present embodiment, the bidirectional pin $111_i$ is connected to the input/output circuit. The input/output circuit has an input/output buffer 1, a scan flip-flop SFF 4 constituting a shift resistor, a selection circuit 5, an OR circuit 6, and an EXOR circuit (exclusive-OR circuit) 7.

The input/output buffer 1 comprises an input buffer 2 and output buffer 3 connected to the bidirectional pin $111_i$. The SSF 4 is supplied with the output from the EXOR circuit 7, and stores the data according to the timing of SCANCLK signal S105, and outputs the stored data. The selection circuit 5 is supplied with the output of the input buffer 2 and the output of the SFF 4, and selects one of these outputs according to the high-number-pins-test switch signal S101 and outputs it to the internal circuit or the subsequent SFF as the input $S102_1$. The OR circuit 6 is supplied with the control signal (enable signal) S103 which enables the output buffer 3 and the high-number-pins-test switch signal S101, and outputs the logic OR of these signals to set the bidirectional pin $111_i$ to the output mode during the test mode. The EXOR circuit 7 is supplied with the control signal S103 and the output signal $104_i$ from the internal circuit in the LSI, and outputs the logic exclusive-OR.

While only the signal from the output of the internal circuit (the output of the EXOR circuit 7) to the SFF 4 is shown in FIG. 2A, the SFF 4 receives the output from the preceding SFF and the output of the EXOR circuit 7. It comprises a multiplexer supplied with the output from the preceding SFF and the output of the EXOR circuit 7 and selecting one of these signals according to the scan-enable signal. The SFF 4 further comprises a flip-flop supplied with the signal selected by the multiplexer as Data input.

As shown in FIG. 2B, in the LSI 110 of the present embodiment, the input pin $112_j$ is connected to the input/output circuit. The input/output circuit has an input buffer 11 connected to the input pin $112_j$, an SFF 12 constituting the shift resistor with the SFF 4 and so on, a selection circuit 13, and an output buffer 14.

The SFF 12 is supplied with the output of the preceding SFF, the output of the selection circuit 5 connected to the preceding SFF or the scan-in signal as Data input. It reads the signal at the timing according to the SCANCLK signal $105_2$ and supplies the stored data to the selection circuit 13. The selection circuit 13 is supplied with the output of the input buffer 11 and the output of the SFF 12, and selects one of these outputs according to the high-number-pins-test switch signal S101 and outputs it as the input $S102_2$ for the internal circuit. The high-number-pins-test switch signal S101 turns on and off the output buffer 14 to put it into an enable state or a high impedance state. If the output buffer 14 is in the enable state during the test mode, the input pin $112_j$ is in the output mode.

As shown in FIG. 2C, in the LSI 110 of the present embodiment, the output pin $113_k$ is connected to the output circuit. The output circuit has an output buffer 21 connected to the output pin $113_k$, and an SFF 22 constituting the shift resistor with the SFF 4, the SFF 12 and so on.

The SFF 22 consists of a flip-flop having the multiplexer at the input, which selects and outputs one of the output signal $S104_2$ from the internal circuit and the output of the preceding SFF according to the scan-enable signal. The SFF 22 reads it at the timing according to the SCANCLK signal $S105_3$, and outputs the stored data.

It is possible to supply the high-number-pins-test switch signal S101 to the OR circuit 6 and the selection circuit 5 and the high-number-pins-test switch signal S101 to the output buffer 14 and the selection circuit 13, for example, from the high-number-pins-test switch signal pin 145 shown in FIG. 1 via a common signal line. The high-number-pins-test switch signal S101 may be set to "High" during the test mode and "Low" during operation mode, for example.

The configuration of the unused pins belonging to the bidirectional pin $111_i$ is determined according to the high-number-pins-test switch signal S101. That is, the high-number-pins-test switch signal S101 turns on the output buffer 3 of FIG. 2A during the test mode to force the bidirectional pins $111_i$ into the output mode. It prevents noises from entering the bidirectional pins $111_i$ and the destruction of the input buffer 2 caused by the noises, even if the bidirectional pin $111_i$ is not connected to the tester, namely becomes the floating pin during the test mode.

During the test mode, the output signal $S104_1$ from the internal circuit is supplied to the SFF 4 and the stored data is supplied to the selection circuit 5 at the timing according to the SCAKNCLK signal $S105_1$. Then, the selection circuit 5 selects the output of the SFF 4 according to the high-number-pins-test switch signal S101 and supplied it to the internal circuit as the input $S102_1$. On the other hand, during operation mode, the high-number-pins-test switch signal S101 is set to "Low". In this case, in input mode, the control signal S103 becomes "Low", the output buffer 3 is turned off, the input from the bidirectional pin $111_i$ is supplied to the selection circuit 5 via the input buffer 2, and the input from the bidirectional pin $111_i$ is selected as the input $S102_1$ for the internal circuit. Also, in the output mode during operation mode, the control signal S103 via the OR circuit 6 turns on the output buffer 3, the output signal $S104_1$ from the internal circuit is outputted from the bidirectional pin $111_i$ via the output buffer 3.

As shown in FIG. 2B, also at the input pin $112_j$, the configuration of the unused pin is controlled using the high-number-pins-test switch signal S101. That is, the output buffer 14 is turned on by the high-number-pins-test switch signal S101, and the input pin $112_j$ is forced into the output mode. Because of this, the input pin $112_j$ does not become open, preventing the destruction of the input buffer 12. On the other hand, during operation mode, the high-number-pins-test switch signal S101 is set to "Low", then the output buffer 14 is turned off, and the input from the input pin $112_j$ is selected at the selection circuit 14 and supplied to the internal circuit as the input $102_2$.

As shown in FIG. 2C, in the output circuit connected to the output pin $113_k$, the SFF 22 takes in the output signal $S104_2$ from the internal circuit during the test mode, then, the signal is outputted from the scan-out pin 144 shown in FIG. 1 or supplied to the subsequent SFF. During operation mode, the output signal $S104_2$ from the internal circuit is outputted via the output pin $113_k$.

Figure 3:
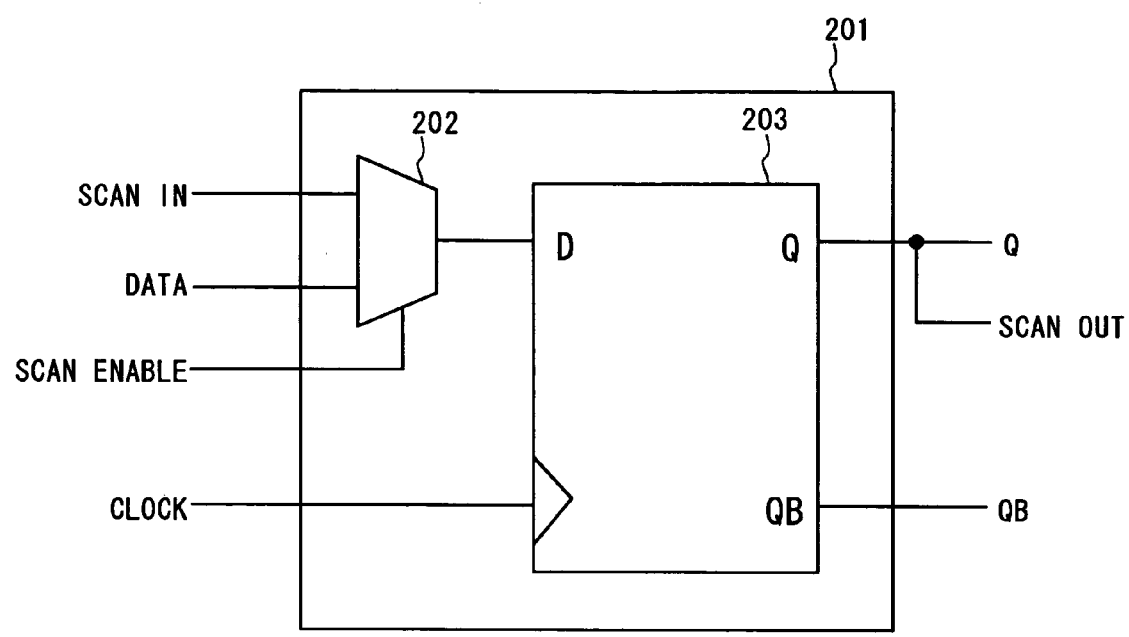
FIG. 3 shows an arrangement of a typical scan flip-flop SFF.

Here, the SFFs for the input/output circuit 121 and output circuit 122 are the same as the SFF for the scan path circuit of the internal circuit 130. Accordingly, each SFF comprises a flip-flop and a multiplexer connected to the Data input of the flip-flop. FIG. 3 shows the arrangement of the typical scan flip-flop SFF. As shown in FIG. 3, the SFF 201 has a selection circuit (multiplexer) 202 which selects one of the scan-in signal and the data signal, and a D-flip-flop 202 which stores the data of the multiplexer 203. The multiplexer 202 is supplied with the scan-enable signal, and selects and outputs one of the scan-in signal outputted from the scan-in pin or the preceding SFF and the output data signal from the combination circuit. The flip-flop 203 is supplied with the output of the multiplexer 202 as Data input, and reads and outputs the data at the timing according to the scan-clock. The output Q can be scanned out and detected during the test mode.

For arranging the scan path circuit, the flip-flop of the corresponding portion is substituted by the scan flip-flop as shown in FIG. 3, and the scan path (scan chain) is configured by connecting the scan flip-flops via a network.

There are two scan schemes, one is a full scan scheme and the other is a partial scan scheme, any of which can be employed. In the full scan scheme, all the flip-flops are substituted by the scan flip-flops, while, in the partial scan scheme, a part of the flip-flops are substituted by the scan flip-flops. When the full scan scheme is employed, all the circuits can be handled as the combination circuit, allowing the easier testing. When the partial scan scheme is employed, the increase of the chip area is reduced.

Figure 4:
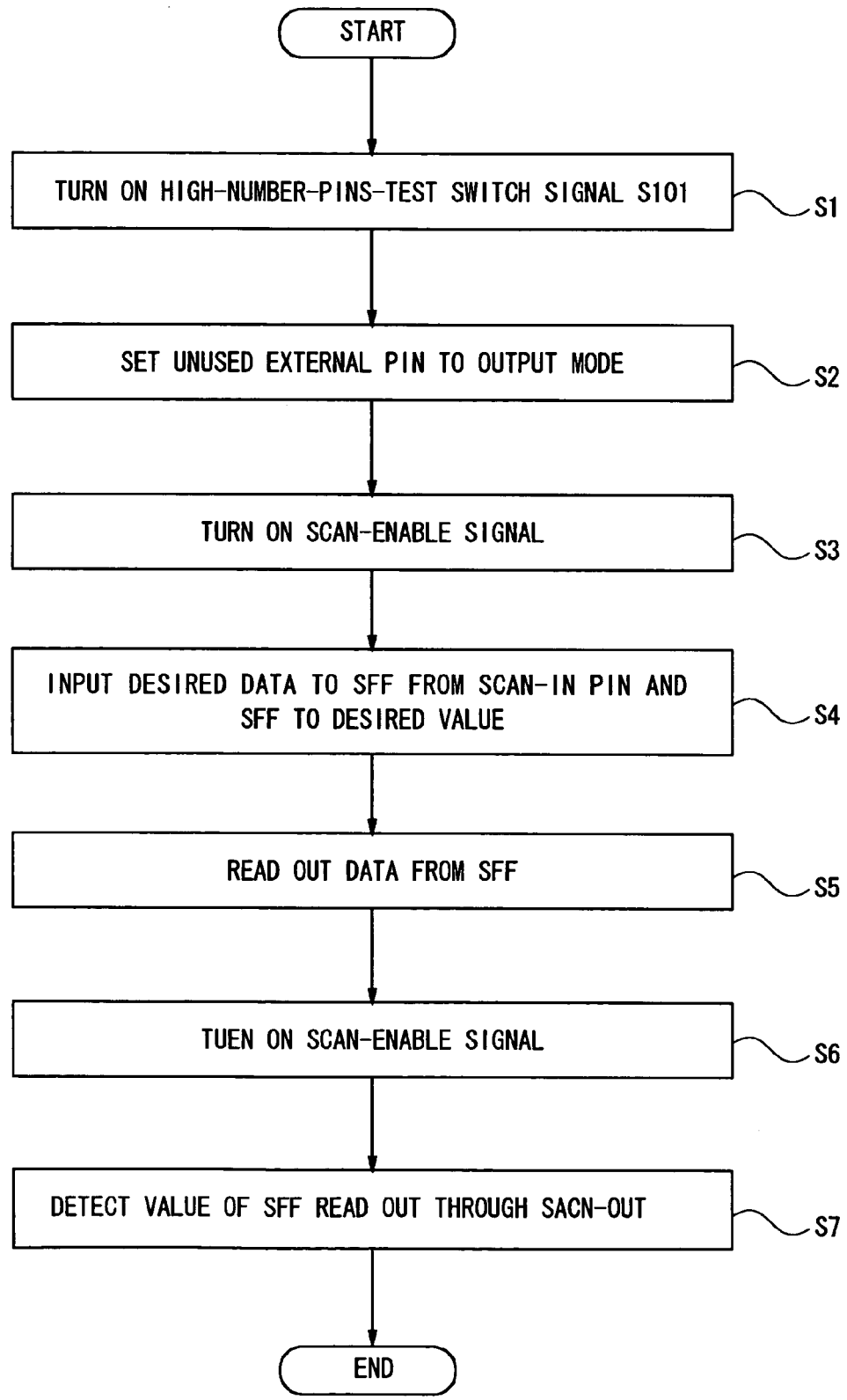
FIG. 4 is a flowchart showing steps for the test of the LSI in accordance with the embodiment of the present invention.
Figure 5:
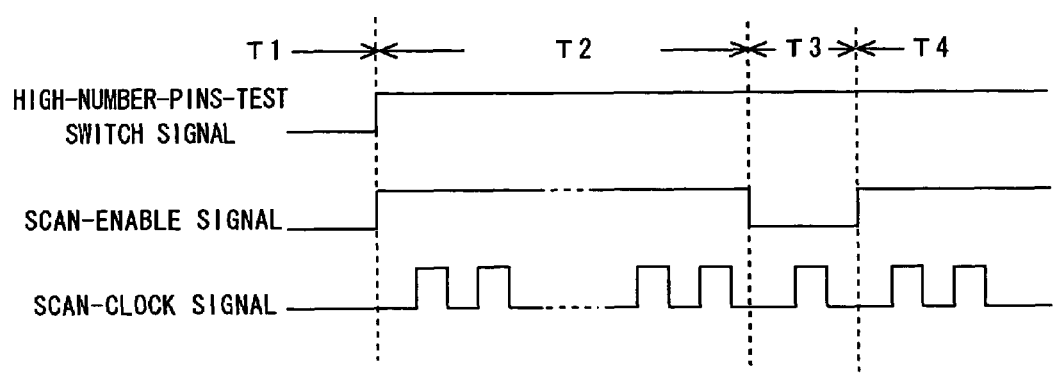
FIG. 5 is timing chart showing the logic level of the switching signal S101 of the high-number-pins tester, the scan-enable signal and scan-clock signal.

Next, the scan test method of the LSI 110 of the present embodiment is explained. FIG. 4 is a flowchart showing the procedure of the test method. FIG. 5 is timing chart showing the logic levels of the high-number-pins-test switch signal S101, the scan-enable signal and the scan-clock signal.

As shown in FIG. 5, before the testing (period T1), the high-number-pins-test switch signal S101 is "Low". When starting the scantest, as shown in FIGS. 4 and 5, the high-number-pins-test switch signal S101 is turned on ("High") (step S1). This sets the bidirectional pin 111$_i$ and the input pin 112$_j$ shown in FIG. 2 to the output mode (step S2). The scan path test hereafter is the same as the known arts. That is, the scan-enable signal is turned on ("High") (step S3), and the desired data (scan-in signal) is inputted from the scan-in pin. Then the SFF is set to a desired value by the shift resistor operation (scan shift) according to the scan-clock signal (step S4, period T2).

Subsequently, the scan-enable signal is turned off ("Low"), the SFF reads the data (step S5, period T3), the scan-enable signal is turned on ("High") (step S6), and the desired value of the SFF is detected at the scan-out by another shift resistor operation (step S7, period T4). When the test is completed, the high-number-pins-test switch signal S101 is turned off ("Low") again.

According to the present embodiment, by arranging the scan chain with the SFF between the external pins and internal circuit 130, the scan-in signal can be supplied to the internal circuit 130 without routing the external pins, so that it is possible to perform the same test as the case where the scan-in signal is inputted from the external pins. Accordingly, even if there are more external pins than the tester pins, there is no need for preparing a new tester or binding the input signals into one, and thus, it is possible to perform the connection test of the internal circuit with the desired test signals. In this case, if the floating pins during the test mode are the input pins or the bidirectional pins, they are forced into the output mode by the high-number-pins-test switch signal S101. Thus, even if these pins are not connected to the tester, they do not become open, so that noise cannot come in and destroy the input buffer connected to the external pin.

Next, the second embodiment of the present invention is explained. In the first embodiment above, the input pins and the bidirectional pins in the input mode are forced into the output mode by the high-number-pins-test switch signal, preventing noises from coming into the floating pins and destroying the input buffer connected thereto. On the other hand, in the present embodiment, the floating pins are forced to be connected to the power source or the ground according to the high-number-pins-test switch signal. This prevents the destruction of the input buffer similarly to the case of the first embodiment. FIG. 6 shows the enlarged external pin portion according to the embodiment of the present invention. In the embodiment shown in FIG. 6, the constituent elements identical to those of the first embodiment shown in FIG. 2 are assigned with the same reference symbols and the detailed explanation thereof is omitted.

Figure 6A:
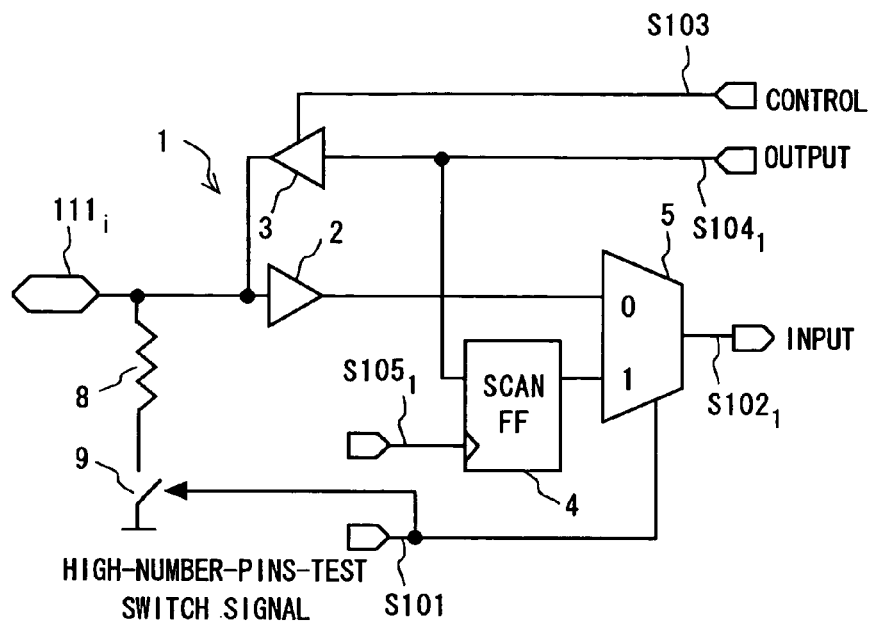
FIGS. 6A-6C shows the enlarged external pin portion according to the embodiment of the present invention.

As shown in FIG. 6A, the bidirectional pin 111$_i$ is connected to the input/output circuit having the input buffer 1, the SFF 4 and the selection circuit 5 which selects and outputs one of the input from the bidirectional pin 111$_i$ and the output from the SFF 4. The bidirectional pin 111$_i$ is connected to a pull-down circuitry. The pull-down circuitry comprises a pull-down resistor 8 connected to the bidirectional pin 111$_i$ and the switch 9 whose one terminal is connected to the pull-down resistor 8 and the other is grounded. During the test mode, the switch 9 is turned on by the high-number-pins-test switch signal S101 to fix the voltage level of the bidirectional pin 111$_i$ to the ground.

Figure 6B:
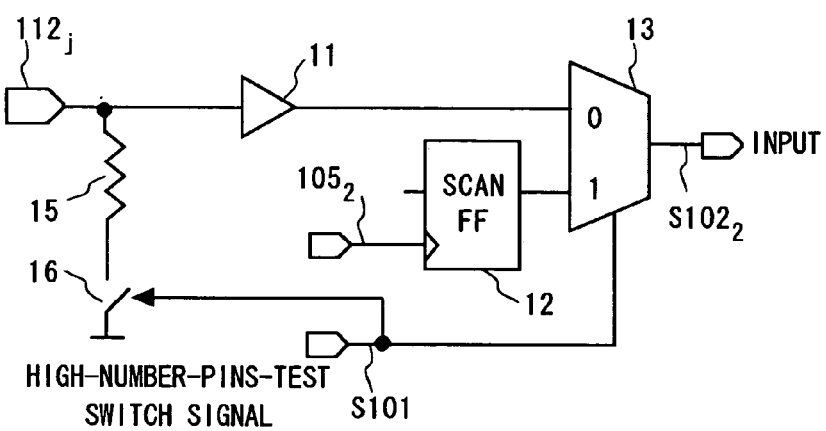
Figure 6C:
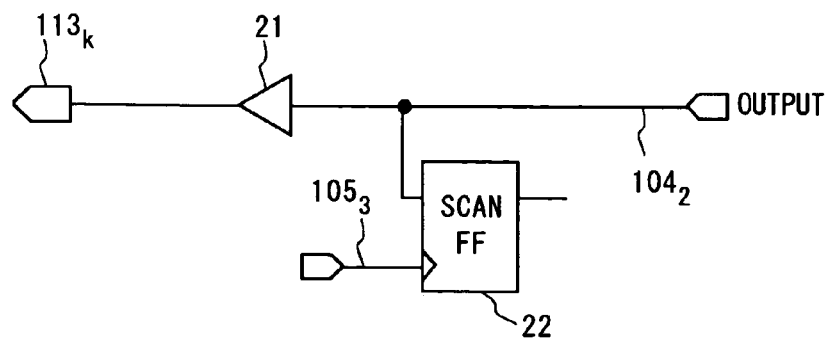
Figure 7:
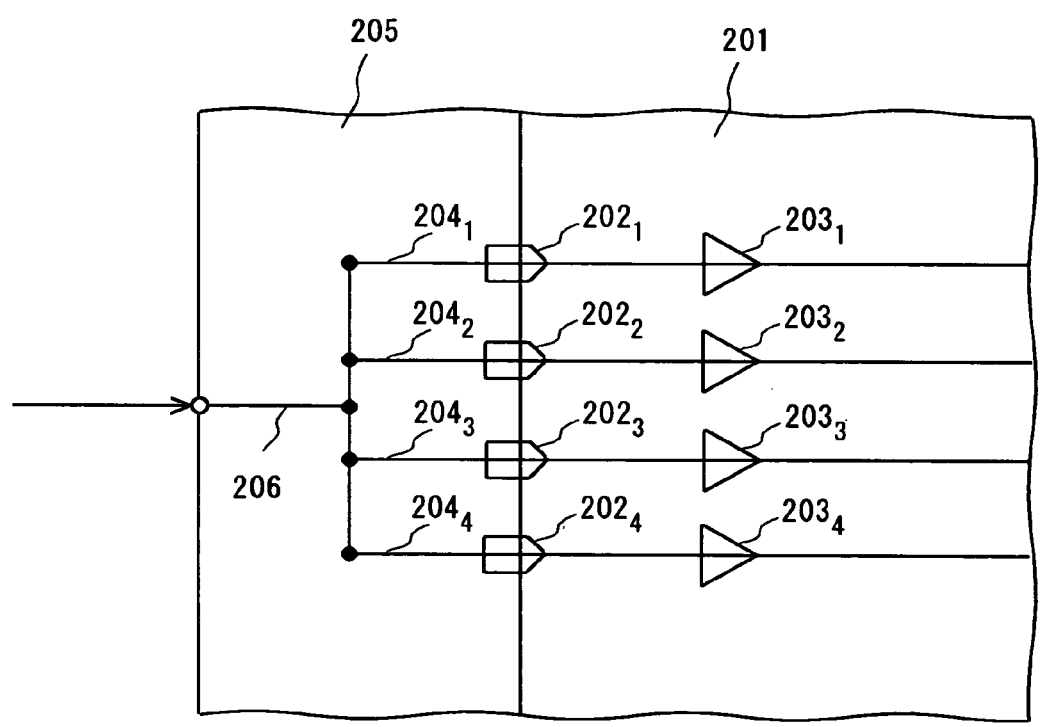
FIG. 7 shows the testing method of the related art integrated circuit device.

Also, as shown in the FIG. 6B, the input pin 112$_j$ is connected to the input/output circuit having the input buffer 11, the SFF 12 and the selection circuit 5 which selects one of the inputs thereof. The input pin 112$_j$ is connected to a pull-down circuitry. The pull-down circuitry comprises a pull-down resistor 15 connected to the input pin 112$_j$ and the switch 16 whose one terminal is connected to the pull-down resistor 15 and the other is grounded. During the test mode, the switch 16, as well as the switch 9, is turned on by the high-number-pins-test switch signal S101, to fix the voltage level of the input pin 112$_j$ to the ground. The arrangement of the output pin shown in FIG. 6C is the same as that of the first embodiment shown in FIG. 2C.

It should be noted that while the present embodiment exemplifies the pull-down circuitry as a means for fixing the voltage level of the external pins (the bidirectional pin and the input pin), it is also possible to use the pull-up circuitry by connecting a resistor and a switch in series between the external pins and the power source and turning on/off the switch by the high-number-pins-test switch signal S101.

According to the present embodiment, even if the tester pins are fewer, the same test as the case of inputting the test signals from all the external pins can be performed by arranging the flip-flop between each input pin and the internal circuit and employing the scantest. In addition, in the present embodiment as well as the first embodiment shown in FIG. 5, during the test mode, the voltage levels of the bidirectional pin 111$_i$ and the input pin 112$_j$ are grounded and stabilized by setting the high-number-pins-test switch signal S101 to High. Thus, the operation instability which would otherwise be caused by the open pin is avoided, and destruction of the input buffer of the input/output buffer is prevented.

It is apparent that the present invention is not limited to the above embodiment and it may be modified and changed without departing from the scope and spirit of the invention.

What is claimed is:

1. An integrated circuit device, comprising:
   a plurality of external pins; and
   an internal circuit connected to the external pins,
   wherein the plurality of the external pins comprises a test pin used during a test mode, an unused external pin not used during the test mode, and a control signal input pin receiving an unused pin control signal which determines a configuration of the unused external pin during the test mode, said unused external pin configured by the unused pin control signal comprising one of an input pin and a bidirectional pin.

2. The integrated circuit device of claim 1, further comprising:
   a shift register comprising a scan flip-flop arranged between the unused external pin and the internal circuit, and connected to each of the unused external pins.

3. The integrated circuit device of claim 1, further comprising:
   an output buffer connected to an input pin and controlled by the unused pin control signal if the unused external pin is the input pin, wherein the input pin is set to an output mode by the unused pin control signal during the test mode.

4. The integrated circuit device of claim 3, wherein the control signal input pin is connected in common to the output buffers of a plurality of the input pins.

5. The integrated circuit device of claim 1, wherein, if the unused external pin is a bidirectional pin connected to an input buffer and an output buffer, the output buffer is connected to the control signal input pin and the bidirectional pin is set to an output mode by the unused pin control signal during the test mode.

6. The integrated circuit device of claim 5, further comprising:
   a logic circuit receiving the unused pin control signal and a control signal controlling the output buffer during an operation mode, wherein the logic circuit outputs the unused pin control signal during the test mode to set the bidirectional pin to the output mode.

7. The integrated circuit device of claim 1, further comprising:
   a voltage-fix block fixing the voltage level of the unused external pins according to the unused pin control signal.

8. The integrated circuit device of claim 7, wherein the voltage-fix block comprises resistors connected to the unused external pins, and switches supplied with the unused pin control signal and connecting the resistors to a power source or a ground.

9. The integrated circuit device of claim 8, wherein the control signal input pin is connected in common to the switches.

10. An integrated circuit, comprising:
    a plurality of external pins; and
    an internal circuit connected to the external pins,
    wherein the plurality of the external pins comprises a test pin used during a test mode, and one or more external pins not used during the test mode, each said external pin not used during the test mode having an associated test circuit based upon whether said external pin comprises an input pin, an output pin, or a bidirectional pin.

11. The integrated circuit of claim 10, wherein said associated test circuit comprises:
    a shift register comprising a scan flip-flop arranged between the unused external pin and the internal circuit, and connected to each of the unused external pins.

12. The integrated circuit of claim 11, wherein one of said external pins comprises a control signal input pin receiving an unused pin control signal which determines a configuration of the unused external pin during the test mode for the associated test circuits for any of an input pin and a bidirectional pin.

13. The integrated circuit of claim 12, wherein, if said unused external pin comprises an input pin, said associated test circuit further comprises:
    an output buffer connected to said input pin and controlled by the unused pin control signal, the input pin being set to an output mode by the unused pin control signal during the test mode.

14. The integrated circuit of claim 13, wherein the control signal input pin is connected in common to the output buffers of a plurality of the input pins.

15. The integrated circuit of claim 12, wherein, if the unused external pin comprises a bidirectional pin connected to an input buffer and an output buffer, the output buffer is connected to the control signal input pin and the bidirectional pin is set to an output mode by the unused pin control signal during the test mode.

16. The integrated circuit of claim 15, said associated test circuit further comprising:
    a logic circuit receiving the unused pin control signal and a control signal controlling the output buffer during operation mode, wherein the logic circuit outputs the unused pin control signal during the test mode to set the bidirectional pin to the output mode.

17. The integrated circuit of claim 10, said associated test circuit comprising:
    a voltage-fix block fixing a voltage level of the unused external pins according to the unused pin control signal.

18. The integrated circuit of claim 7, wherein each voltage-fix block comprises a resistor connected to the unused external pin, and a switch supplied with the unused pin control signal and connecting the resistor to one of a power source and a ground.

19. The integrated circuit of claim 18, wherein the control signal input pin is connected in common to switches of all voltage-fix blocks.

20. A method of testing an integrated circuit device comprising a plurality of external pins and an internal circuit connected to the external pins, the plurality of the external pins including a test pin used during a test mode to provide a test signal, one or more external pins not used during the test mode, and a test control signal input pin receiving a test unused pin control signal, each said external pin not used during the test mode having an associated test circuit based upon whether said external pin comprises an input pin, an output pin, or a bidirectional pin, said method comprising:
    applying said test control signal to thereby determine a configuration of the associated test circuits during the test mode for unused external pins comprising input pins and bidirectional pins; and
    applying said test signal to test said internal circuit.

* * * * *